PHOTOLITHOGRAPHIC ETCHING OF EXTREMELY DETAILED PATTERNS

Filed March 22, 1965 3 Sheets-Sheet 1

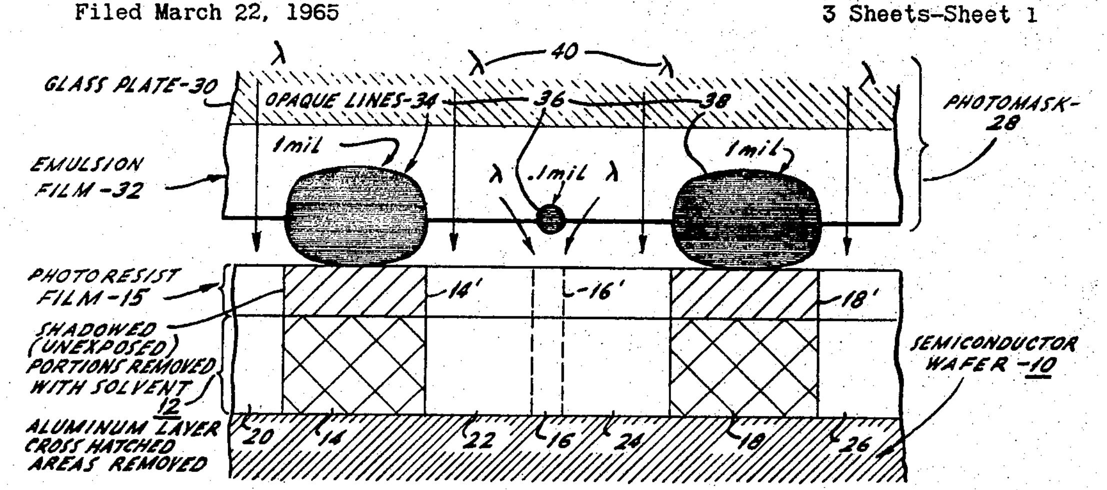

FIG. 1. PHOTOMASK ADJACENT SEMICONDUCTOR WAFER ILLUSTRATING EFFECTIVE LOSS OF NARROW SEPARATION IN PATTERN AREA DUE TO DIFFUSION AND SCATTERING.

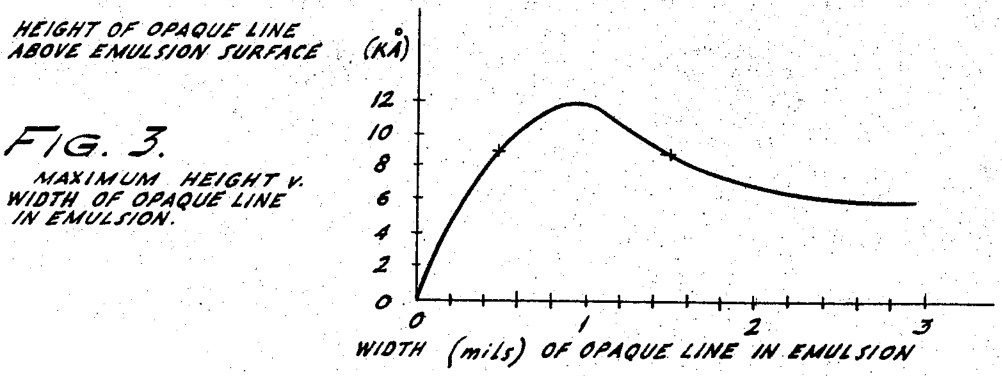

FIG. 3.

MAXIMUM HEIGHT v. WIDTH OF OPAQUE LINE IN EMULSION.

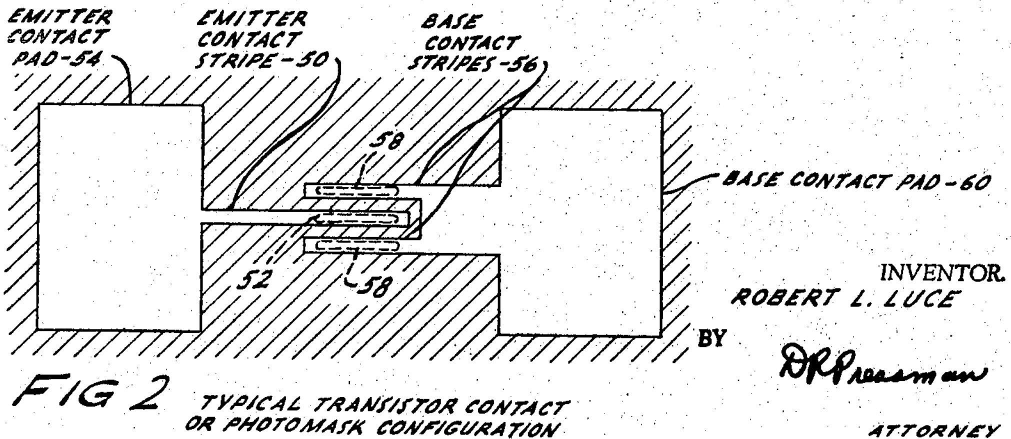

FIG 2 TYPICAL TRANSISTOR CONTACT OR PHOTOMASK CONFIGURATION

INVENTOR.
ROBERT L. LUCE
BY
D R Freeman
ATTORNEY

PHOTOLITHOGRAPHIC ETCHING OF EXTREMELY DETAILED PATTERNS

Filed March 22, 1965 3 Sheets-Sheet 2

SECTIONAL VIEW OF DIFFERENT WIDTH OPAQUE LINES IN EMULSION (VERTICAL DIMENSIONS EXAGGERATED GREATLY)

DIFFERENT SIZE OPAQUE AREAS IN EMULSION (VERTICAL DIMENSION EXAGGERATED GREATLY)

INVENTOR.
ROBERT L. LUCE
BY
D R Pressman
ATTORNEY

Sept. 24, 1968 R. L. LUCE 3,403,024

PHOTOLITHOGRAPHIC ETCHING OF EXTREMELY DETAILED PATTERNS

Filed March 22, 1965 3 Sheets-Sheet 3

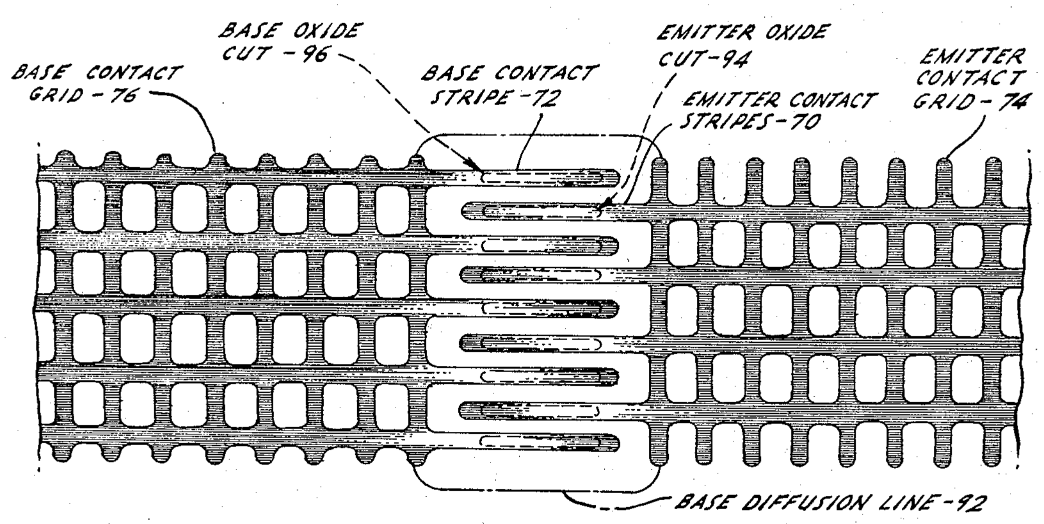

FIG. 6. INTERDIGITATED STRIPES 0.14 mils WIDE WITH 0.05 mil SEPARATION AND RESPECTIVE GRID PATTERN CONTACT AREAS, EACH 2 ¼ mils WIDE.

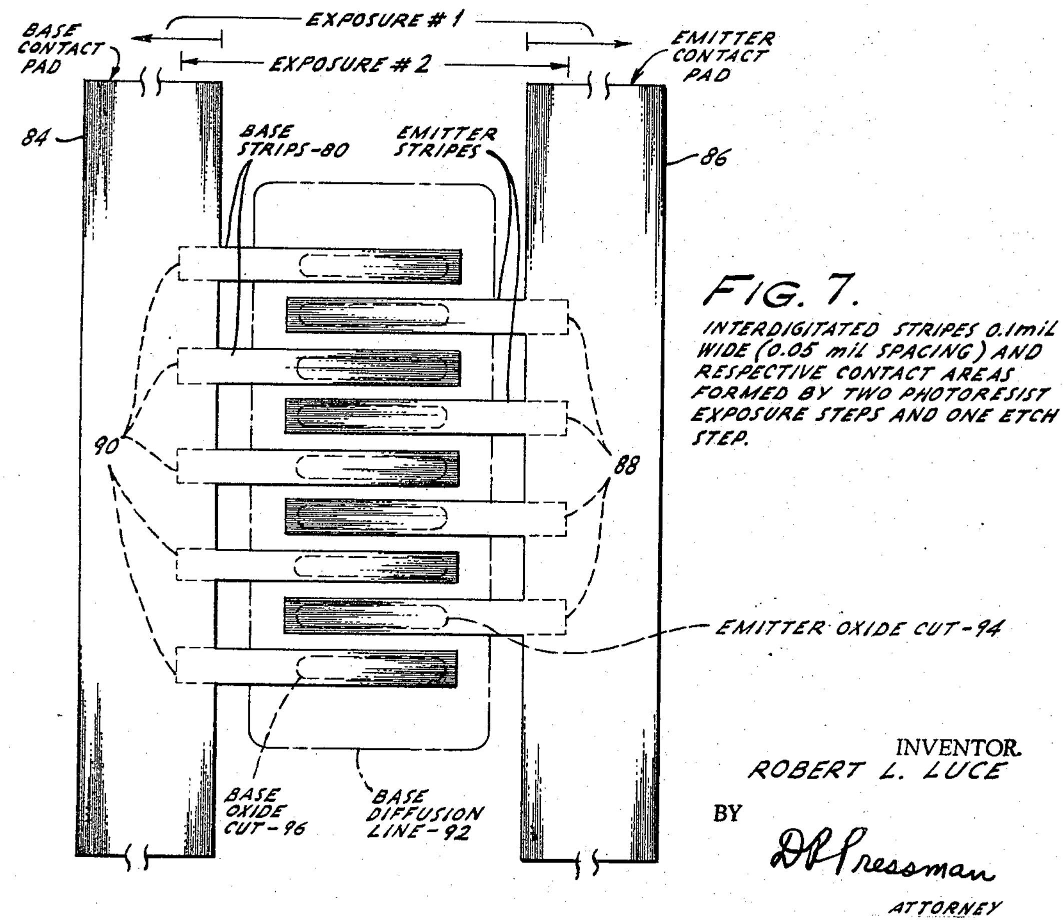

FIG. 7.

INTERDIGITATED STRIPES 0.1 mil WIDE (0.05 mil SPACING) AND RESPECTIVE CONTACT AREAS FORMED BY TWO PHOTORESIST EXPOSURE STEPS AND ONE ETCH STEP.

INVENTOR.
ROBERT L. LUCE

BY D.R. Pressman

ATTORNEY

United States Patent Office 3,403,024

Patented Sept. 24, 1968

3,403,024

PHOTOLITHOGRAPHIC ETCHING OF EXTREMELY DETAILED PATTERNS

Robert L. Luce, North Wales, Pa., assignor to Philco-Ford Corporation, a corporation of Delaware Filed Mar. 22, 1965, Ser. No. 441,690
13 Claims. (Cl. 96—36)

ABSTRACT OF THE DISCLOSURE

Photolithographic etching of extremely detailed patterns using positive photoresist and contact photomask having opaque areas of uniform dimensions to produce uniform swelling to avoid loss of contact of any opaque area. Either single photomask, with detailed portions of opaque areas formed of isolated lines and large opaque areas formed of gridwork of lines; or two photomasks, with detailed opaque areas in first mask and large opaque areas in second mask, may be used.

This invention relates to the photolithographic art and more particularly to a new process for photolithographically forming extremely detailed etch masks. The present invention will be described, by way of example, with reference to the selective masking of the surface of a semiconductive monolith for the purpose of forming metallic connection films thereover. However it will be understood that the scope of the invention is not limited to this application, but is suitable for any application falling within the ambit of the appended claims.

In the formation of monolithic semiconductor devices it is usually required that an intricately-patterned metallic contact and interconnection film be formed on the top of each monolith. This film (usually of aluminum) has heretofore been formed by one of two different photolithographic methods: (1) the metal rejection technique, and (2) the metal etchback technique.

In each of these methods a negative photoresist, i..e, a resist which is rendered insoluble by exposure to light, for example, ultraviolet light, is used to mask selected areas of the monolith. In each method a layer of photoresist is spread over the surface of the monolith, exposed through a mask which is transparent where the photoresist is to remain and then developed by washing with a solvent which will dissolve the unexposed resist but not the exposed resist.

The methods differ in that in the metal rejection technique the areas where the contacts are not wanted are first masked and then a metal layer, usually aluminum, is deposited over the surface of the locally masked monolith. The aluminum will adhere to the unmasked portion of the monolith better than it will adhere to the photoresist masking film. The surface of the monolith is then scrubbed with a solvent which will dissolve exposed photoresist, but not aluminum, thereby removing the photoresist mask and the overlying portions of the aluminum film. The remaining portions of the aluminum film form the desired metal pattern.

In the metal etchback technique, the surface of the monolith is first coated with an aluminum layer. The areas where the contacts are to remain are masked in the manner just described. The remainder of the film is etched away, leaving the contact areas which are protected by the resist. The resist is then removed to expose the desired contact areas.

Neither the metal etchback nor the metal rejection technique is able to delineate extremely detailed metal contact patterns, i.e., those with separations between contact areas having a smallest dimension of about 0.2 mil or less. In addition, the metal rejection technique can provide only thin metal films (2–3000 A.) having high resistance, and the uniformity of these films is strongly dependent on surface conditions of the monolith.

I have traced the inability of these techniques to delineate extremely detailed metal contact patterns to an anomaly in the photomask which is used to selectively expose the photoresist film. In particular, I have found that the photomask, which usually consists of a glass plate with a developed photographic emulsion film thereon, and which is placed in contact with the film of photoresist on the surface of the monolith, has an irregular surface swelling which holds the photomask away from the surface of the monolith, thereby causing loss of detailed pattern areas through optical scattering and diffraction effects. This surface swelling occurs in opaque areas of the photomask and the degree of swelling is dependent on the dimensions of the opaque areas.

It has been found that for opaque lines, maximum swelling occurs with lines having a width of about 0.5 to 1.5 mils, with the degree of swelling sharply decreasing as line width becomes smaller and gradually decreasing as line width becomes larger. For opaque areas it has been found that swelling is dependent on the length and width of the opaque area, with maximum swelling occurring in opaque areas which for emulsions in current use, are about 1.0 x 1.0 mil square.

OBJECTS

Accordingly several objects of the present invention are:

(1) To provide a new and improved photolithographic etch process;

(2) To provide a photolithographic process for forming extremely detailed patterns;

(3) To provide a photolithographic process which avoids the drawbacks of localized swelling in photomasks, and (4) To provide a photolithographic pattern delineating process which is capable of providing low resistance adherent metal films whose properties are not critically dependent on substrate surface conditions, and (5) To provide a new and improved photo exposure mask.

Other objects and advantages of the present invention will become apparent from a consideration of the ensuing description thereof.

SUMMARY

According to one preferred embodiment of the present invention an extremely detailed metallic layer is formed over the surface of a substrate using the metal etchback technique and a positive photoresist masking film. The photographic exposure mask, which is placed in contact with the photoresist masking film during the selective exposure thereof, has opaque areas patterned to define the areas of the metallic layer to be retained. The photomask areas are designed so that the size of the opaque areas thereof will be such that no opaque area will swell sufficiently to preclude any other opaque area from preventing exposure radiation from reaching the photoresist film.

DRAWINGS

FIG. 1 depicts a cross sectional showing of a photomask adjacent a semiconductor wafer covered by an aluminum layer and a photoresist film.

FIG. 2 shows a typical transistor or photomask configuration.

FIG. 3 depicts a plot of height v. width of an opaque line in a photographic emulsion.

FIG. 6 shows one type of metallic contact pattern produced according to the present invention.

FIG. 7 shows another type of metallic contact pattern produced according to the present invention.

FIG. 1—PRIOR ART

Figure 4:
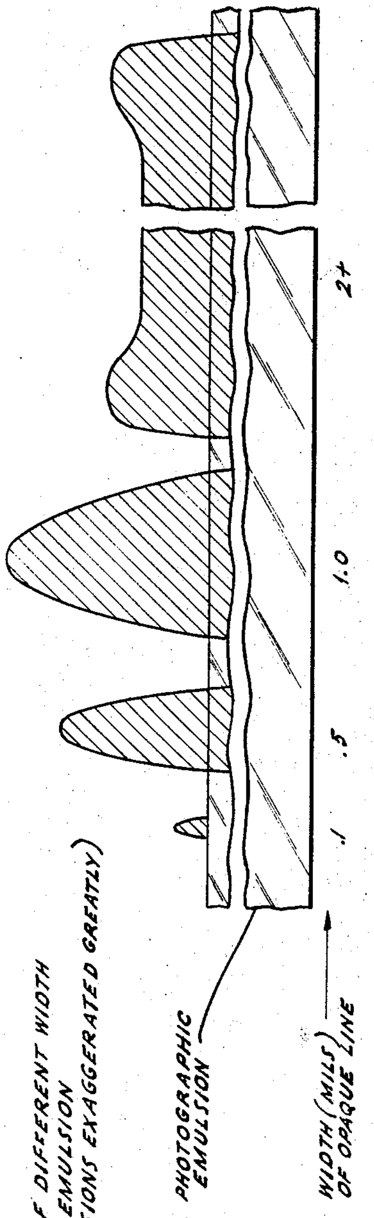
FIG. 4 shows cross sectional views of different width opaque lines in a photographic emulsion.

FIG. 1 illustrates several aspects of the prior art etchback process.

Assume that a semiconductor wafer 10, which may have a passivating surface oxide thereover (not shown), is to have an aluminum surface contact layer deposited thereover according to a desired pattern. According to the prior art metal etchback technique, which is described for exemplary purposes, an aluminum layer 12 is deposited over the entire surface of the wafer. It will be assumed that it is desired to pattern aluminum contact layer 12 such that the line areas 14, 16, and 18 are to be removed and areas 20, 22, 24, and 26 are to remain. It will be assumed also that the width of line 16 is very small, e.g., about 0.1 mil, and that the width of lines 14 and 18 is about 1.0 mil.

A photoresist film 15 is despoited over aluminum layer 12. In order that film 15 forms a mask so that lines 14, 16, and 18 of layer 12 can be etched away, it will be apparent that corresponding lines 14', 16', 18' must be removed from film 15. This is done by exposing the rest of film 15 to a form of illumination which will render the same insoluble, e.g., ultraviolet light.

Accordingly, a photomask 28 comprised of a transparent glass plate 30 having a transparent photographic emulsion film 32 thereon with opaque lines 34, 36, and 38 is placed in contact with film 15.

It will be noted that each of the opaque lines 34, 36, and 38 produces a localized swelling in the emulsion film 32, with the wider 1 mil opaque line producing a much greater swelling than the narrower 0.1 mil opaque line. This swelling is produced during the photographic process in which the opaque lines are formed by the liberation of free silver from the emulsion.

It will be noted that the swelling of the 1.0 mil wide opaque lines 34 and 38 is sufficient to hold photomask 28 relatively far away from photoresist film 15 and that no contact is made between the 0.1 mil wide opaque line 36 and film 15. Although 1.0 mil opaque lines 34 and 38 form shadow areas 14' and 18' in film 14 when luminous energy 40 is directed at film 15 through mask 28, scattering and diffusion effects prevent the 0.1 mil wide opaque line 36 from casting a similar shadow. Light will be reflected and bent around line 36 due to its separation from film 15 to expose area 16' of film 15, thereby rendering area 16' insoluble and preventing the formation of the desired separation in the aluminum layer 12 at this point. This illustrates why the production of metal pattern areas which incorporates very small separations was heretofore unfeasible.

If the width of opaque lines 34 and 38 is made very large, so that these lines effectively become opaque areas, the swelling of areas 34 and 38 will be slightly reduced but will still be sufficient to preclude region 36 from preventing radiation from reaching film 15. The use of a negative photoresist film 15 dictates that film 32 will have large opaque areas which will swell sufficiently to hold any narrow opaque areas present (which are representative of separations between aluminized areas) sufficiently far enough away from photoresist film 15 to preclude these narrow opaque areas from casting a clear or any shadow on the photoresist film in the presence of activating radiation. It has been found that the minimum separation between aluminized areas reproducible according to present photolithographic techniques is approximately 0.20 mil.

FIGURE 2

FIG. 2 shows a typical surface contact configuration for a transistor and hence the configuration of the photomask used to form said contact configuration. The nonshaded areas in FIG. 2 represent aluminum surface contacts on a monolith of silicon which has emitter, base, and collector regions therein, and which is passivated by a surface oxide of silicon. Emitter contact stripe 50 is deposited over a hole 52 cut in the surface oxide over the emitter region. A relatively large contact for the emitter stripe is provided by contact pad 54 so that suitable leads, which are usually much larger than the emitter stripe 50, be connected thereto. Similarly base contact stripes 56 are deposited over holes 58 overlying the base region and a base contact pad 60 is arranged to make contact with stripes 56.

Although it is desirable for many reasons to make the transistor as small as possible, it is impossible to delineate a pattern where the emitter and base contact stripes 50 and 56 would be separated by less than about 0.2 mil. This is because the large opaque areas of the photomask (representative of nonaluminized areas) will swell sufficiently to hold the photomask and the smaller opaque areas thereof (e.g., the opaque region separating emitter and base contact stripes 50 and 56) far enough away from the underlying photoresist-covered monolith to preclude these smaller opaque areas from casting a shadow on the photoresist film. The present invention overcomes this drawback.

FIGS. 3 TO 5—SWELLING OF OPAQUE AREAS

In order to provide a better understanding of the present invention certain data and theory based on quantitative measurements and analytical deductions are given below and in FIGS. 3 to 5 of the drawings. It is to be understood that the validity of the invention is not dependent on the accuracy or correctness of the theory and data since the advantages of the structure and process as claimed can be demonstrated empirically.

It has been observed that in photographic emulsions currently used for making photomasks, the swelling of opaque "lines" (i.e., areas whose width is many times smaller than their length) is related to line width as indicated in FIG. 3. The ordinate dimensions in thousands of angstrom units are approximate only due to the extreme difficulty in measuring such small heights. However the relative magnitudes of the ordinates are fairly accurate. As can be seen in FIG. 3, height reaches a maximum when the width of the opaque lines is 1 mil. An opaque line width decreases, height decreases sharply, but as width increases, height decreases gradually and remains approximately constant for opaque lines having a width greater than 3 mils.

A cross sectional view of opaque lines of different width is shown in FIG. 4, wherein vertical dimensions have been greatly exaggerated to facilitate illustration. The photographic emulsion (shown in broken form) is transparent. The opaque lines of .1, .5 and 1.0 mil widths have progressively increasing heights, whereas the last opaque line, whose width is 2 mils or more, has a maximum height which is less than that of the 1.0 mil line. The swelling at the edges of the two mil line is greater than that at the center portion thereof. This phenomenon will be discussed infra.

Figure 5:
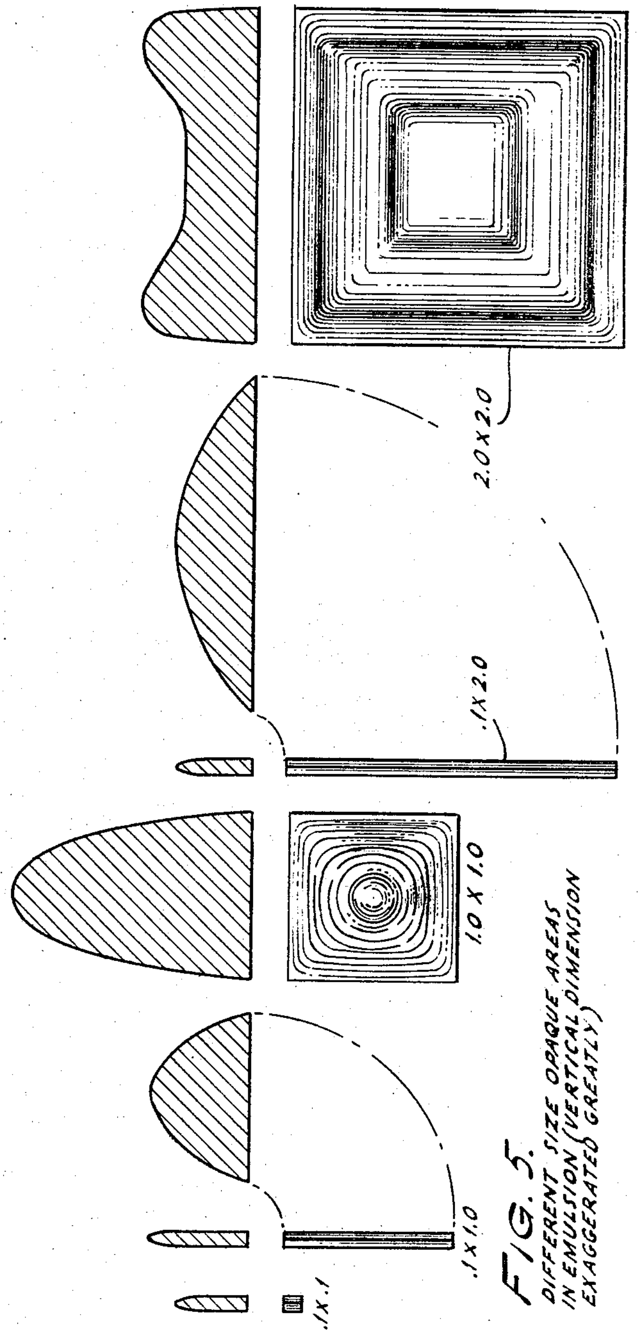
FIG. 5 shows plan and cross sectional view of different size opaque areas in an emulsion.

FIG. 5 illustrates the relative swelling produced by opaque areas of different sizes. The lower half of FIG. 5 shows plan views of opaque areas of various sizes, the respective dimensions of which are indicated in mils. The upper half of FIG. 5 shows cross sectional views (vertical dimensions greatly exaggerated) of the opaque areas in the lower half of FIG. 5. Both end and side cross sectional views are shown for oblong opaque areas.

The swelling produced by the 1.0 x 1.0 mil opaque area is greater than that produced by the .1 x 1.0 mil opaque area, which, in turn, is greater than that of the .1 x .1 mil opaque area. This illustrates that swelling is a function of both the length and width of an opaque area.

A comparison of the .1 x 2.0 mils opaque area with the 2.0 x 2.0 mils opaque area also verifies this.

However it will be noted that the swelling of the 1.0 x 1.0 mil area is greater than that of the 2.0 x 2.0 mils area. This illustrates that in areas as well as lines, swelling tends to be maximized when size approximates 1.0 mil. In fact if one dimension of the 2.0 x 2.0 mils area were reduced to 1.0 mil, the swelling thereof will be increased.

It is believed that the theory underlying these phenomena is as follows. As is well known, an opaque area in a photographic emulsion is formed by exposing the undeveloped emulsion to light which liberates some free silver in the exposed portions of the emulsion. Developing of the exposed emulsion causes more free silver to be formed at the exposed portions to render the same opaque.

It is believed that the greater swelling manifested at the edge portions of relatively large opaque areas is produced because optical exposure causes a slight but uniform swelling of the opaque area. Subsequent developing of the emulsion through the use of a developing solution increases this swelling more at the edges than at the center portion because of the greater surface area at the edges and greater circulation of developer at the edges.

This edge swelling is not manifested in small opaque areas because less light reaches these areas during exposure and insufficient silver is liberated to trigger the edge swelling phenomenon during development.

It is believed that the maximum swelling produced in 1.0 mil opaque areas is because the edge swelling phenomenon occurs within 0.5 mil of the edge, and in a 1.0 mil opaque area, the 0.5 mil edge swellings would occur at the same situs and cumulate vertically to produce the maximized swelling.

FIGURE 6

One aspect of the present invention is illustrated in FIG. 6, which is a diagram of an actual transistor surface contact pattern which was fabricated in accordance with the present invention. An important characteristic of this pattern which differentiates it from prior art patterns is that the emitter contact stripe 70, the base contact stripe 72, the emitter contact grid 74, and base contact grid 76 all are made up of lines of approximately equal width. Preferably the width of these lines lie outside the range of .5 mil to 1.5 mil at which maximum swelling occurs. In one device constructed according to said pattern the emitter and base contact stripes 70 and 72 were but 0.14 mil wide and the separation between an emitter stripe 70 and an adjacent base stripe 72 measured only 0.05 mil. The emitter contact pad 74 and base contact pad 76 are in the form of grids, for a reason to be explained presently.

To form the pattern of FIG. 6 having the dimensions indicated, a positive photoresist and a photomask wherein the opaque areas represent metalized contact areas are used. In other words, the ouaque areas of the photomask will have the same configuration as the contact pattern in FIG. 6. A positive photoresist is one which is rendered soluble in those areas which are exposed, while the unexposed areas will remain insoluble. Thus it will be apparent that exposure of a positive photoresist through a photomask having the configuration of FIG. 6, followed by development of said photoresist and localized etching of the underlying aluminum will produce a contact pattern having the configuration of FIG. 6.

A photomask having the configuration of FIG. 6 will have a far more uniform swelling than the one illustrated in FIG. 2. Such a photomask should be designed so that no opaque line has a width in the range 0.5 to 1.5 mil which produces the maximum swelling aforenoted. Each line in the grid patterns 74 and 76 has the same width as the emitter and base stripes 70 and 72, which are the narrowest lines used in the pattern. These grid patterns have been found to decrease greatly the swelling in these areas in relation to solid areas of the same size, so that the resultant swelling is not much greater than the swelling of the emitter and base stripes per se. The use of a positive photoresist makes possible the use of a photomask wherein the opaque areas delineate metalized contact areas, rather than the surrounding nonmetalized areas on the substrate, thereby avoiding a photomask with large opaque areas, such as seen in FIG. 2.

Since the swelling of the opaque areas of the photomask of FIG. 6 is nearly uniform, all opaque areas, including those with less than 0.5 mil dimensions will be in contact with, or sufficiently close to the photoresist to avoid loss of pattern configurations through the optical effects aforediscussed, which occur when large, solid opaque areas and opaque areas having 0.5 to 1.5 mil dimensions are use simultaneously.

It has been found feasible to connect contact wires or etched contact films to the grid contact areas 74 and 76 in the same manner theretofore used to make connections to solid contact pads.

FIGURE 7

FIG. 7 illustrates another embodiment of the invention wherein the contact pattern is formed in two exposure steps and one etch step. In this embodiment solid rather than grid-shaped contact pads are delineated. The embodiment of FIG. 7 is suitable for use where very narrow stripes and spacings are to be formed.

The surface of the semiconductive monolith is covered by a layer of aluminum followed by a first positive photoresist film, as before. The photoresist film is subjected to an exposure through a contact photomask having two rectangular opaque areas, as indicated at 84 and 86, for the base and emitter contact pads, respectively. Areas 84 and 86, which are indicated in partial showings only, may have a square or oblong shape and can have any size desired. Areas 84 and 86 should be formed within the "Exposure #1" area indicated. This first photoresist film is then developed to remove the exposed portions thereof and the assembly is baked to harden the developed photoresist slightly. The monolith will be covered by two photoresist mask areas at the emitter and base contact pads 84 and 86.

Next the surface of the monolith is covered by a second positive photoresist film. This film will overlie the previously formed base and emitter contact pad mask areas, and will actually partially dissolve these areas, although not to a significant extent. This second photoresist film is then exposed through a second contact photomask having a series of narrow opaque base and emitter stripes with small interspacings. By way of example the stripes may have a width of 0.1 mil and interspacing of 0.05 mil. These base and emitter stripes may have the configuration indicated at 80 and 82, respectively, in FIG. 7, and be formed within the "Exposure #2" area indicated. It will be apparent that no pattern loss will occur due to optical effects resulting from swelling of opaque areas since all opaque areas are of identical size.

The second photomask should be designed so that the tips 88 and 90 of the emitter and base stripes overlap the base and emitter pads 84 and 86 so that contacts will be made therewith. Thereafter the photoresist is developed and baked. The underlying aluminum can now be etched as before.

This technique is not limited to a double exposure step or the simple contact configuration shown; far more complex patterns may dictate three or more exposure steps, each incorporating opaque areas of substantially uniform size. Also the above-described exposure sequence can be reversed so that the emitter and base stripes are exposed before the larger contact pads.

It will be apparent that by using either the constant line width technique of FIG. 6, or the multiple exposure technique of FIG. 7, patterns far more detailed than any heretofore extent can be photolithographically delineated.

EXAMPLE OF SPECIFIC TECHNIQUE

The following is given as an example of one specific processing technique which an be used for the process of FIG. 6.

A wafer of silicon may have several hundred microcircuits formed therein. (This wafer will later be separated into respective microcircuit monoliths.) Each monolith may have a diffused base (indicated at 92 in FIGS. 6 and 7) and a series of oblong emitter diffusions (diffusion line not indicated). Each monolith is covered with a passivating surface layer of silicon dioxide. A series of oblong cuts is made in the surface oxide so that the emitter and the base regions can be contacted. The emitter oxide cuts are indicated at 94 and the base oxide cuts at 96.

The wafer is then covered with a layer of aluminum, and then with a film of positive photoresist. One suitable positive photoresist is known as Shipley Resist AZ1350 made by the Shipley Co., Inc., Wellsley, Mass. After exposure through one or more contact photomasks using a strong ultraviolet light source (e.g., a 200 w. mercury vapor lamp), the photoresist is developed by washing the exposed portions thereof away with a suitable developer, such as Shipley AZ developer, and then baked. Thereafter the underlying aluminum is locally etched with a solution comprised of 80 parts conc. phosphoric acid. 4 parts conc. nitric acid, and 18 parts water. The exposed and developed photoresist forms an etching mask which will not be affected by this solution. The developed resist film is then removed with a suitable solvent which will not affect the underlying aluminum or silicon dioxide. One such solvent is known as "Resist Strip J100" and is manufactured by the Indust-Ri-Chem Laboratory, 811 S. Sherman St., Richardson, Tex.

The dual exposure process of FIG. 7 is performed in a similar manner except that two photoresist films are formed, with respective exposures and baking steps as indicated. Both photoresist films may be baked for 25 minutes, with the first being baked at 160° C and the second at 145° C.

It will be apparent that the present invention is not limited to the formation of photoresist etch masks for etching aluminum surface contacts, but rather may be utilized in all types of photolithographic etch applications, including the formation of cuts through the surface oxide of semiconductors for diffusion and ohmic contact formation operations.

While there has been described what are at present considered to be the preferred embodiments of the invention, it will be apparent that various modifications and other embodiments thereof will occur to those skilled in the art within the scope of the invention. Accordingly, it is desired that the scope of the invention be limited by the appended claims only.

I claim:

1. A process for forming a photoresist pattern mask, comprising:

(a) forming a positive photoresist film over a substrate, (b) placing a photographic negative comprising a developed silver halide emulsion film and a transparent substrate therefor in contact with said photoresist film such that said emulsion film faces said photoresist film, said emulsion film having an opaque region shaped to have a substantially uniform swelling thereover, (c) exposing said negative to light of a frequency and intensity sufficient to activate said photoresist film in the portion thereof not masked by said opaque region, (d) developing said photoresist film to remove said activated portion thereof, (e) forming a second positive photoresist film over said substrate, (f) placing a second photographic negative comprising a developed silver halide emulsion film and a transparent substrate therefor in contact with said photoresist film such that said emulsion film faces said photoresist film, said emulsion film having an opaque portion shaped to have a substantially uniform swelling thereover different from the swelling of said first-named negative, (g) exposing said negative to light of a frequency and intensity sufficient to activate said photoresist film in a portion thereof not masked by said opaque region, and (h) developing said second photoresist film to remove said activated portion thereof.

2. The process of claim 1 wherein said opaque regions of said first and second negatives occupy areas which overlap.

3. A process for forming a photoresist pattern mask, comprising:

(a) forming a positive photoresist film over the surface of a body to be masked, (b) exposing said film to actinic radiation through a photomask placed in contact with said photoresist film, said photomask having a transparent region and an opaque region, said opaque region being formed of elongated portions of substantially constant width, said photomask comprising a transparent substrate covered by a photographic emulsion film of the type that swells during development in said elongated opaque portions thereof, the degree of swelling being an irregular function of an edge-to-edge dimension of each opaque portion, one area of said opaque region consisting of a gridwork of said elongated portions, and another area of said opaque region including at least one opaque line with which no opaque lines intersect for a distance therealong which is longer than the distance between intersections in said gridwork, and (c) developing said exposed photoresist film to remove the exposed portions thereof.

4. A process for forming a photoresist pattern mask, comprising:

(a) forming a positive photoresist film over the surface of a body to be masked, (b) exposing said film to actinic radiation through a photomask placed in contact with said photoresist film, said photomask having a transparent region and an opaque region, said opaque region being formed entirely of elongated portions of a substantially constant width less than 0.5 mil, one part of said opaque region being formed of a uniform gridwork of opaque lines and another part thereof including at least one opaque line with which no opaque lines intersect for a distance therealong which is longer than the distance between intersections in said gridwork, the width of said opaque lines in said gridwork and the width of said one opaque line being substantially the same and not greater than 1.5 mils, said photomask comprising a transparent substrate covered by a photographic emulsion film of the type that swells during development in said elongated opaque portions thereof, the degree of swelling being an irregular function of an edge-to-edge dimension of each opaque portion, and (c) developing said exposed film to remove the exposed portions thereof.

5. A process for forming a photoresist pattern mask, comprising:

(a) forming a first positive photoresist film over the surface of the body to be masked, (b) exposing said first photoresist film to actinic radiation through a first photomask placed in contact with said film, said photomask comprising a transparent substrate covered by a developed photographic emulsion film having a transparent portion and a plurality of opaque portions, said emulsion film being of the type that swells during development in the opaque portions thereof, the degree of swelling being an irregular function of an edge-to-edge dimension of each opaque portion, the dimensions of said opaque portions being such that all have approximately the same degree of swelling, (c) developing said first photoresist film, (d) forming a second positive photoresist film over the surface of said body, (e) exposing said second photoresist film to actinic radiation through a second photomask placed in contact with said film, said second photomask being similar to said first photomask except the opaque portions of said second photomask being dimensioned so that all have a same degree of swelling which is different from the degree of swelling of the opaque portions of said first photomask, and (f) developing said photoresist to remove the exposed portions thereof.

6. The process of claim 5 wherein a layer of a substance to be locally etched is formed over said first substrate prior to step (a) and wherein an etchant which will attack said substance but not said photoresist film is applied to said substrate subsequent to step (f).

7. A process for locally etching a layer of a substance which covers the surface of a body, comprising:

(a) forming a film of a positive photoresist over said layer, (b) locally exposing said film to actinic radiation in the areas thereof overlying the areas of said layer to be locally etched by placing a photomask in contact with said film and exposing said photomask to said radiation, said photomask comprising a developed film of photographic emulsion on a transparent substrate, said emulsion having a transparent portion and a plurality of opaque portions, and being of the type that swells during development in the opaque portions thereof, the degree of swelling being an irregular function of an edge-to-edge dimension of each opaque portion, said transparent portion having a configuration the same as the areas of said layer of said substance to be locally etched, said opaque portions being dimensioned to have a substantially uniform swelling thereover, one of said opaque portions being formed of a uniform gridwork of opaque lines and another of said opaque portions including at least one opaque line with which no opaque lines intersect for a distance therealong which is longer than the distance between intersections in said gridwork, the width of said opaque lines in said gridwork and the width of said one opaque line being substantially the same and not greater than 1.5 mils, (c) developing said photoresist by removing the exposed portions thereof with an etchant to which said exposed portions are sensitive, and (d) locally etching said layer with an etchant which will attack said layer but not the remaining portions of said photoresist.

8. The process of claim 7 wherein said substrate is a monolithic microcircuit wafer, said evaporated substance is aluminum, and the remaining portions of said photoresist are removed subsequent to step (d).

9. A process for forming a layer of a substance over the surface of a body according to a predetermined configuration, comprising:

(a) forming a solid layer of said substance over the surface of said body, (b) forming a film of a positive photoresist over said layer, (c) locally exposing said film to actinic radiation in the areas thereof overlying the areas of said layer to be locally etched by placing a photomask in contact with said film and exposing said photomask to said radiation, said photomask comprising a film of photographic emulsion on a transparent substrate, said emulsion having a transparent portion and an opaque portion, said emulsion being of the type that swells during development in the opaque portion thereof, the degree of swelling being an irregular function of an edge-to-edge dimension of said opaque portion, said opaque portion having said predetermined configuration and being formed entirely of opaque lines having a substantially uniform width, one area of said opaque portion being formed of a gridwork of lines, and another area thereof including at least one opaque line with which no opaque lines intersect for a distance therealong which is longer than the distance between intersections and said gridwork, (d) developing said photoresist by removing the exposed portions thereof with an etchant to which said exposed portions are sensitive, and (e) locally etching said layer with an etchant which will attack said layer but not the remaining portions of said photoresist.

10. A process for forming a layer of a substance over the surface of a body according to a predetermined configuration, comprising:

(a) forming a solid layer of said substance over the surface of said body, (b) forming a film of a positive photoresist over said layer, (c) locally exposing said film to actinic radiation in the areas thereof overlying the areas of said layer to be locally etched by placing a photomask in contact with said film and exposing said photomask to said radiation, said photomask comprising a film of photographic emulsion on a transparent substrate, said emulsion having a transparent portion and an opaque portion, said emulsion being of the type that swells during development in the opaque portion thereof, the degree of swelling being an irregular function of an edge-to-edge dimension of said opaque portion, said opaque portion having said predetermined configuration and being formed entirely of opaque lines having a substantially uniform width, one area of said opaque portion being formed of a uniform gridwork of opaque lines and another area thereof including at least one opaque line with which no opaque lines intersect for a distance therealong which is longer than the distance between intersections in said gridwork, the width of said opaque lines in said gridwork and the width of said one opaque line being substantially the same and not greater than 1.5 mils, (d) developing said photoresist by removing the exposed portions thereof with an etchant to which said exposed portions are sensitive, and (e) locally etching said layer with an etchant which will attack said layer but not the remaining portions of said photoresist.

11. A process for locally etching a layer of a substance deposited on the surface of a body, comprising:

(a) forming a first film of a positive photoresist over said layer, (b) locally exposing a plurality of first areas of said first film to actinic radiation by placing a first photomask in contact with said film and exposing said photomask to said radiation, said photomask comprising a film of developed photographic emulsion on a transparent substrate, said emulsion having transparent portion and opaque portions and being of the type that swells during development in the opaque portions thereof, the degree of swelling being an irregular function of an edge-to-edge dimension of each opaque portion, the dimensions of said opaque portions being such that the degree of swelling of none is sufficient to preclude any other from preventing said radiation from reaching said protoresist, (c) developing said first photoresist film, (d) forming a second positive photoresist film over said substrate, (e) locally exposing at least one second area of said second photoresist film to activating radiation by placing a second photomask in contact with said film and exposing said photomask to said radiation, said photomask comprising a film of developed photographic emulsion of the same type as the emulsion described in clause (b) on a transparent substrate, said emulsion having a transparent portion and at least one opaque portion whose size is larger than that of any opaque portion of said first photomask, said opaque area of said second photomask having a degree of swelling substantially the same and different from the swelling of the opaque areas of said first photomask, (f) developing said second photoresist film, and (g) locally etching said layer with an etchant which will attack said layer but not the remaining portions of said photoresist.

12. A contact photomask for local exposure of a photoresist film, comprising: a transparent substrate having a substantially flat surface, a developed photographic emulsion film formed on said surface, said emulsion film having a transparent portion and an opaque portion and being of the type that swells during development in the opaque portion thereof, the degree of swelling being an irregular function of an edge-to-edge dimension of said opaque portion, said opaque portion including at least one opaque line having a uniform width less than 0.5 mil and at least one region formed of a gridwork of opaque lines having the same width as said one line.

13. A process for forming a photoresist pattern mask, comprising:

(a) forming a positive photoresist film over a substrate, (b) placing a photographic negative comprising a developed silver halide emulsion film and a transparent substrate therefor in contact with said photoresist film such that said emulsion film faces said photoresist film, said emulsion film having an opaque region shaped to have a substantially uniform swelling thereover, one part of said opaque region being formed of a uniform gridwork of opaque lines and another part thereof including at least one opaque line with which no opaque lines intersect for a distance therealong which is longer than the distance between intersections and in said gridwork, (c) exposing said negative to actinic radiation of a frequency and intensity sufficient to activate said photoresist film in the portion thereof not masked by said opaque region, and (d) developing said photoresist film to remove said activated portion thereof.

References Cited

UNITED STATES PATENTS

| | | | |
|---|---|---|---|
| 2,566,265 | 8/1951 | Tuttle | 96—27 X |
| 3,201,239 | 8/1965 | Neugebauer et al. | 96—75 X |

NORMAN G. TORCHIN, *Primary Examiner.*

R. E. MARTIN, *Assistant Examiner.*